Figure 1:
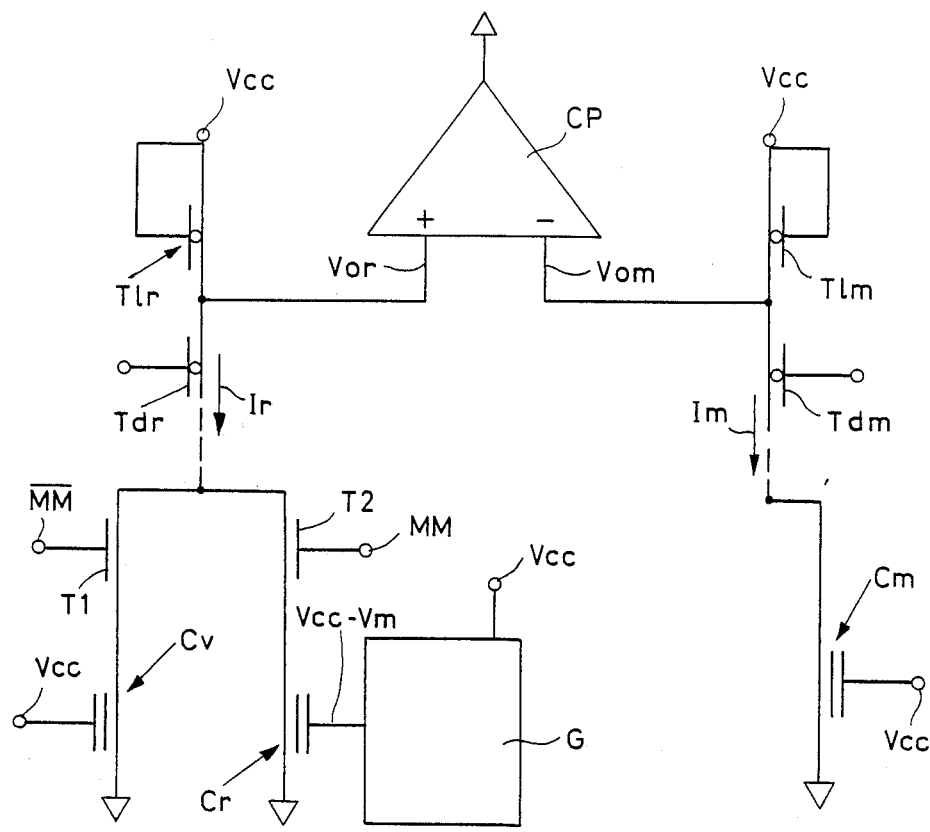

United States Patent [19]

Casagrande et al.

[11] Patent Number: 4,802,166
[45] Date of Patent: Jan. 31, 1989

[54] DEVICE FOR THE VERIFICATION OF MEMORY CELLS ON THE BASIS OF THE THRESHOLD DROP OBTAINABLE DURING WRITING

[75] Inventors: Giulio Casagrande, Vignate; Roberto Gastaldi, Milan, both of

[73] Assignee: SGS Microelecttronica S.p.A., Catania, Italy

[21] Appl. No.: 835,059

[22] Filed: Feb. 28, 1986

[30] Foreign Application Priority Data

Mar. 28, 1985 [IT] Italy ................. 20127 A/85

[51] Int. Cl.<sup>4</sup> ............................................. G11C 11/29
[52] U.S. Cl. ...................................... 371/21; 365/201
[58] Field of Search ........................... 371/21, 25, 67; 365/200, 201, 210

[56] References Cited

U.S. PATENT DOCUMENTS

| 4,460,982 | 7/1984 | Gee | 371/21 X |
| 4,504,929 | 3/1985 | Takemae | 371/21 X |
| 4,612,630 | 9/1986 | Rosier | 371/21 X |
| 4,670,708 | 6/1987 | Bosnyak | 371/21 X |

FOREIGN PATENT DOCUMENTS 147899 9/1983 Japan ........................... 371/21

Primary Examiner—Jerry Smith
Assistant Examiner—Robert W. Beausoliel
Attorney, Agent, or Firm—Cushman, Darby & Cushman

[57] ABSTRACT

A comparator has two inputs, one controlled by a circuit branch including a written cell being examined and one controlled by another circuit branch including a virgin cell. In parallel with the latter is placed another reference cell controlled in an adjustable manner in such a way as to raise the threshold of the written cell which the device is able to discriminate and accept.

5 Claims, 3 Drawing Sheets

DEVICE FOR THE VERIFICATION OF MEMORY CELLS ON THE BASIS OF THE THRESHOLD DROP OBTAINABLE DURING WRITING

The present invention relates to a device for the verification of the operation of memory cells on the basis of a threshold drop obtainable during writing.

In the most recent generation of memory cells (EPROM type), a programming voltage has been reduced to 12.5 volts with the result that the threshold change or drop obtainable in writing (or unprogrammed) compared with virgin cell conditions.

To convert the status information of a cell, written or not, into a 1 or 0 binary information usable in various ways, it is usual to employ differential detection amplifiers. These amplifiers, on the basis of the state of a cell being examined, produce an unbalance in one direction or the other of a comparator with two controlled inputs, one from a circuit branch including the cell being examined and one from another circuit branch including a virgin cell.

These are very sensitive high-gain amplifiers which make it possible to detect very small threshold drops.

It must also be considered that a very small threshold drop will create problems during writing both as to the ability of discriminating between a written state and an unwritten state, and in relation to the reading times, which must not be too long. The small unavoidable load losses (intrinsic load loss) of the cell therefore becomes important.

In reality, the threshold drop should be such as to ensure accurate detection over a broad power and temperature range with minimal access time. It is also well to ensure a certain margin of safety against intrinsic load loss of the cell.

At present, the problem of small threshold drops is avoided by using writing methods (intelligent algorithms) which, after the usual verification of the state of the cell, call for the application of a longer final impulse whose purpose is to add a certain margin of safety.

This solution is not optimal, however, because it brings about losses of writing time with no guarantee of the required safety margin.

The inventors of the present invention have recognized that an effective solution could be the accomplishment of a device capable of sensing the state of the cell on the basis of threshold values higher than otherwise allowed by its high sensitivity, in such a manner as to make possible a verification of the cell on the basis of a threshold drop higher than otherwise discriminable by the amplifier.

The object of the present invention is accordingly to accomplish such a device for verification of memory cells on the basis of the threshold drop obtainable during writing, said device being capable of discriminating the written cells on the basis of a fairly high threshold drop to avoid problems in the writing stage.

In accordance with the invention, this object is achieved by means of a device comprising a comparator with two controlled inputs, one from a circuit branch including a cell being examined and one from another circuit branch including a virgin cell, characterized in that said other circuit branch includes also, in parallel with said virgin cell, another reference cell controlled in an adjustable manner.

In other words, the usual differential detection amplifier has added on the virgin cell side therefore, a reference cell which makes it possible to vary the unbalancing point of the comparator and hence the threshold drop discriminable by the device.

This makes it possible to perform a verification more in conformity with the writing requirements, and to avoid additional verification impulses as in the known technique. If, on the contrary, the verification proves unsatisfactory, it is possible to discard the cells with insufficient threshold drop, optionally replacing them with redundant cells.

Figure 2:
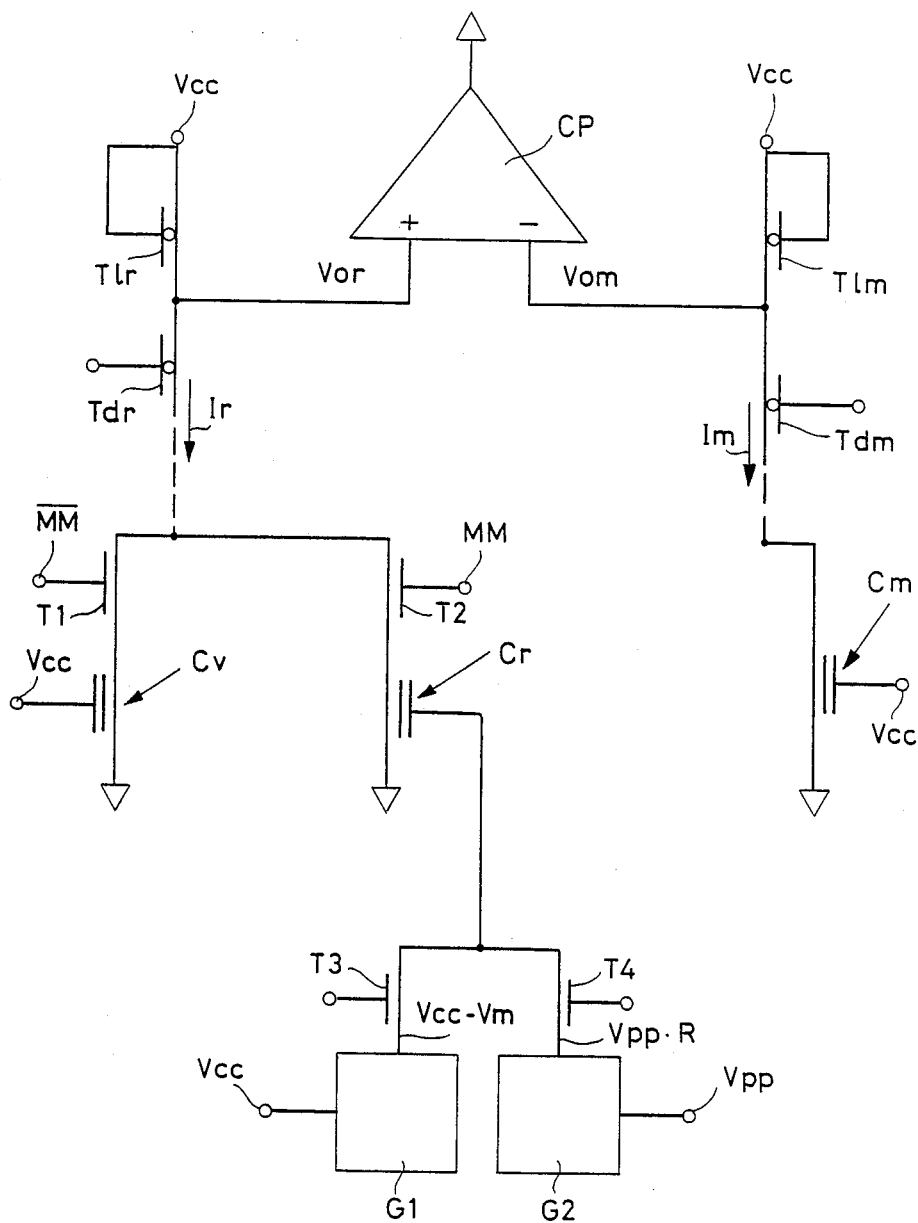
Figure 3:
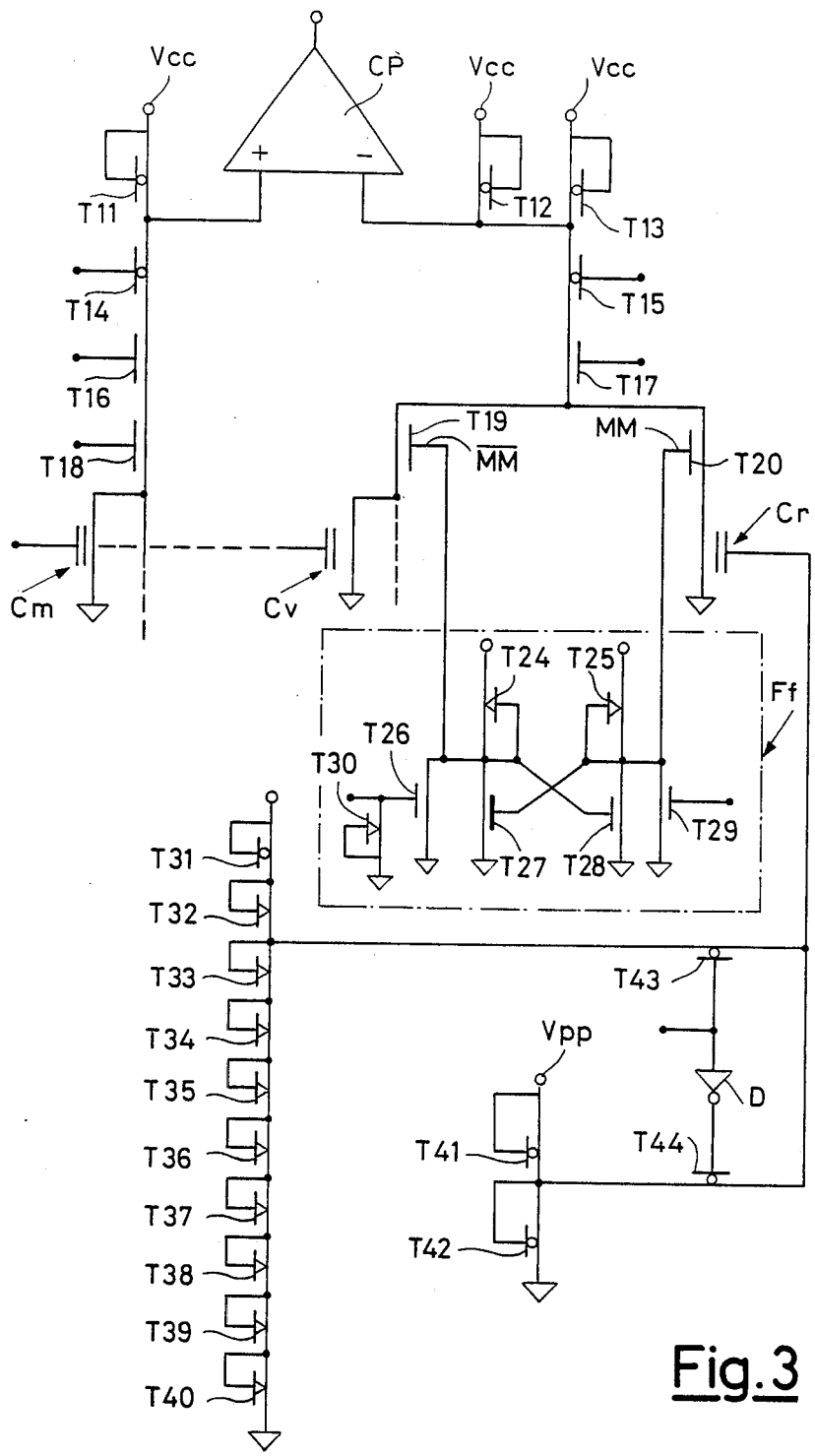

These and other characteristics of the present invention will be made clear by the following detailed description of some practical embodiments illustrated as examples in the annexed drawings wherein FIG. 1 shows the general diagram of a first embodiment of the device in accordance with the invention, FIG. 2 shows a similar diagram of a second embodiment of the device in accordance with the invention, and FIG. 3 shows a more detailed diagram of a third embodiment of the device in accordance with the invention.

The device illustrated in FIG. 1 comprises a comparator CP having two inputs, positive and negative, controlled by respective circuit branches R and M which are polarized with voltage Vcc. Vor and Vom in FIG. 1 indicate the input voltages of the comparator CP, said voltages being produced by the aforesaid circuit branches.

The circuit branch M which makes up the main or matrix branch includes the cell under examination indicated with Cm and controllable (when selected within a multicell memory) with voltage Vcc, a capacitive decoupling transistor Tdm with polarization voltage Vb and a load transistor Tlm polarized with voltage Vcc and having gain Klm. Im indicates the current flowing in circuit branch M.

Circuit branch R which constitutes the reference branch includes a load transistor Tlr with polarization Vcc and gain Klr>Klm, a capacitive decoupling transistor Tdr with polarization Vb and, selectable alternatively from among enhancement transistors T1 and T2 with reversed control voltage $\overline{MM}$ and MM, a virgin cell Cv controllable with voltage Vcc and another reference cell Cr controllable with adjustable voltage Vcc-Vm through a voltage generator or voltage divider G which in turn uses the control voltage Vcc. Ir indicates the current flowing through circuit branch R.

With T1 conducting and T2 cut off, the device operates in the writing phase exactly like a differential amplifier of the known type. That is, it compares the cell under examination Cm with the virgin cell Cv. Because of the different gains Klr>Klm of the two load transistors Tlr and Tlm, respectively an unbalancing of the comparator CP in one direction is caused if (Vor>Vom) if the cell under examination Cm is virgin also, (so that Im≠0), and an unbalancing of the comparator CP itself in the opposite direction (Vor<Vom) is caused if the cell under examination is written (so that Im=0 or is somewhat smaller than Ir).

An analysis of the behaviour of the device with the change in threshold drop produced in the written cell compared with the virgin state may be made under quasistatic reading conditions and on the simplified assumption that the comparator gain is infinite, in the following manner:

$$Ir = Kc(Vcc - Vtc)^2 \qquad (1)$$

$$Im = Kc(Vcc - Vtc - DVtc)^2 \quad (2)$$

$$Im = Klm(Vcc - Vtl - Vom)^2 \quad (3)$$

$$Ir = Klr(Vcc - Vtl - Vor)^2 = A^2 Klm(Vcc - Vtl - Vor)^2 \quad (4)$$

wherein $A^2 = Klr/Klm$; Vtc is the threshold of the virgin cell; DVtc is the threshold drop caused by writing; Kc, Klm and Klr are respectively the gains of the cell, of the load transistor on the matrix side Tlm and of the load transistor Tlr on the reference side; and Vtl is the threshold of the two load transistors.

As mentioned above, a cell under examination will appear written if Vor<Vom, and not written if Vor>Vom. There will be an uncertainty threshold for Vor=Vom depending on the value of Vcc because it is possible that a cell will appear written for low Vcc values and not writen for higher values.

The relationship between the highest operating Vcc (Vccmax) and the threshold drop of the matrix cell (DVtc) can be obtained by replacing in (3) and (4) Vor=Vom and thus obtaining $$Ir = A^2 Im \quad (5)$$

and then combining (1), (2) and (5) in such a manner as to drive $$Kc(Vccmax - Vtc)^2 = A^2 Kc(Vccmax - Vtc - DVtc)^2$$

from which with easy passes is obtained $$Vccmax = Vtc + \frac{A}{A-1} DVtc \quad (6)$$

From this relationship it is clear that the maximum Vcc usable is higher in proportion to the increase in the threshold drop DVtc. This demonstrates that it is certainly beneficial to have A as small as possible.

On the other hand, technical calculations and experimental testing have shown that with the device of FIG. 1 used in the conventional manner in verifying writing with Vcc=6 V, which is the greatest value usable in practice, the threshold drop is still too low to ensure correct reading and correct operation of the device.

This problem is avoided by using the reference cell Cr in place of the virgin cell Cv, in the device i.e. operating with T1 cut off and T2 conducting.

In this manner the expression (1) changes as follows:

$$Ir = Kc(Vcc - Vm - Vtc)^2 \quad (7)$$

Combining (7) with (2) and (5) we obtain $$Kc(Vccmax - Vm - Vtc)^2 = A^2 Kc(Vccmax - Vtc - DVtc)^2 \quad (8)$$

and lastly $$Vccmax = Vtc + \frac{A}{A-1}\left(DVtc' - \frac{Vm}{A}\right) \quad (9)$$

from which it is seen that by polarizing the control gate of the reference cell Cr with Vcc-Vm, the effect that detection of the written cell with a predetermined Vccmax requires a greater threshold drop (DVtc') than that (DVtc) required to secure the same Vccmax with normal reference to a virgin cell with polarization Vcc, i.e.

$$DVtc' = DVtc + \frac{Vm}{A}$$

By giving the reference appropriate dimensions, it is possible to predetermine a margin that will ensure correct operation over the entire power supply voltage and temperature range with minimal access time in addition to being a guarantee against intrinsic load loss and noise.

In other words, the device of FIG. 1 makes it possible to discriminate the cells under examination on the basis of a threshold drop greater than that which can at present be discriminated.

A variant of the proposed device, illustrated in FIG. 2, also makes possible measurement of the threshold drop obtained after writing.

This is obtainable by making the reference cell Cr controllable in accordance with the state of enhancement transistors T3 and T4 not only from circuit block G1 but also from a further circuit block G2 (a voltage divider) with polarization voltage $V_{pp}$.

By reading an unwritten matrix cell with any Vcc (e.g. 5 V) and varying $V_{pp}$ it is possible to find a Vppmax such that the cell changes from virgin to written by the effect of the anomalous polarization applied to the cell Cr.

In this case equation (6) becomes $$Kc(Vppmax' \cdot R - Vtc)^2 \, Kc(Vcc - Vtc)^2$$

from which $$Vppmax' \cdot R = Vtc + A(Vcc - Vtc) \quad (10)$$

After writing reading can be done with Vcc equal to the previous value and Vpp sought so that cell Cm is judged uncertain between written and virgin (Vppmax'').

Again for equation (6) is obtained $$Kc(Vppmax'' R - Vtc)^2 = A^2 Kc(Vcc - Vtc - DVtc)^2$$

from which
$$Vppmax'' R = Vtc + A(Vcc - Vtc) - ADVtc \quad (11)$$

Finally, by subtraction from (10) to (11) we obtain
$$DVtc = R/A(Vppmax' - Vppmax'')$$

with which the threshold drop can be calculated.

A possible implementation of the device in accordance with the invention for a 256K EPROM memory is illustrated in detail in FIG. 3.

Transistors T11, T14, T16 and T18 therein make up the polarization and column selection circuit of a matrix bit line BLm wherein is included a Cm cell under examination.

With normal reading (conventional operation) the reference circuit made up of transistors T12, T13, T15, T17 and T19 and of a reference bit line BLr including a virgin cell Cv is gated.

In the manner in accordance with the invention, operating for a higher threshold drop, transistor T19 is cut off and the reference bit line Blr is consequently disconnected while through transistor T20 is connected reference cell Cr the gate of which can be polarized either with the circuit T31–T40 (where T31 is a transistor with threshold near 0 and the others are the depletion type), which makes it possible to ensure a fixed threshold drop, or with the T41, T42 circuit (in combination with T43, T44 and D) which makes it possible to measure the threshold drop by measuring Pvvmax.

A flip-flop FF made up of transistors T24–T29 (where T17 is a high-threshold transistor) keeps the circuit in the desired operating condition once it is appropriately arranged in the desired steady state and to automatically force the circuit into the conventional reading mode upon turning on.

We claim:

1. A device for verification of a memory cell under examination on the basis of a threshold drop obtainable in the writing phase of said memory cell under examination, comprising:
    a comparator with two controlled inputs, one from a circuit branch including said cell under examination and another from another circuit branch, said another circuit branch including a virgin cell, and a reference cell in parallel with said virgin cell and controlled in an adjustable manner.

2. A device in accordance with claim 1 further comprising a voltage generator, wherein said cell under examination is driven by a control voltage, and said reference cell is controllable through said voltage generator, said voltage generator having a voltage value lower than the control voltage of the cell under examination.

3. A device in accordance with claim 1 further comprising a variable voltage generator, wherein said reference cell is further controllable through said variable voltage generator which makes it possible to measure a threshold drop produced by the writing of the cell under examination.

4. A device in accordance with claim 1 further comprising:
    a voltage generator, wherein said cell under examination is driven by a control voltage, and said reference cell is controllable through said voltage generator, said voltage generator having a voltage value lower than the control voltage of the cell under examination; and
    a variable voltage generator which makes it possible to variably control said reference cell.

5. A device in accordance with claim 4 further comprising means for selecting one or the other of said generators for controlling said reference cell.

* * * * *